United States Patent
Lee et al.

(10) Patent No.: US 8,093,583 B2
(45) Date of Patent: *Jan. 10, 2012

(54) LIGHT EMITTING DIODE HAVING BARRIER LAYER OF SUPERLATTICE STRUCTURE

(75) Inventors: Sang Joon Lee, Ansan-si (KR); Duck Hwan Oh, Ansan-si (KR); Kyung Hae Kim, Ansan-si (KR); Chang Seok Han, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 291 days.

This patent is subject to a terminal disclaimer.

(21) Appl. No.: 12/517,314

(22) PCT Filed: Nov. 21, 2007

(86) PCT No.: PCT/KR2007/005840
§ 371 (c)(1),
(2), (4) Date: Jun. 2, 2009

(87) PCT Pub. No.: WO2008/082081
PCT Pub. Date: Jul. 10, 2008

(65) Prior Publication Data
US 2010/0059735 A1  Mar. 11, 2010

(30) Foreign Application Priority Data

Dec. 28, 2006  (KR) .................. 10-2006-0136684

(51) Int. Cl.
*H01L 29/06* (2006.01)
*H01L 31/00* (2006.01)

(52) U.S. Cl. ................ 257/22; 257/15; 257/17; 257/18; 257/E33.028

(58) Field of Classification Search .................... 257/15, 257/E33.028, 22
See application file for complete search history.

(56) References Cited

U.S. PATENT DOCUMENTS

| 6,040,588 A | 3/2000 | Koide et al. |
| 6,060,335 A | 5/2000 | Rennie et al. |
| 2003/0124789 A1 | 7/2003 | Koide et al. |
| 2004/0113169 A1 | 6/2004 | Asami et al. |

(Continued)

FOREIGN PATENT DOCUMENTS

JP  10-135514  5/1998

(Continued)

OTHER PUBLICATIONS

Extended European Search Report Dated Aug. 10, 2010.

(Continued)

*Primary Examiner* — Lynne Gurley
*Assistant Examiner* — Hsin-Yi Hsieh
(74) *Attorney, Agent, or Firm* — H.C. Park & Associates, PLC

(57) ABSTRACT

A light emitting diode (LED) having a barrier layer with a superlattice structure is disclosed. In an LED having an active region between an GaN-based N-type compound semiconductor layer and a GaN-based P-type compound semiconductor layer, the active region comprises a well layer and a barrier layer with a superlattice structure. As the barrier layer with the superlattice structure is employed, it is possible to reduce occurrence of defects caused by lattice mismatch between the well layer and the barrier layer.

8 Claims, 3 Drawing Sheets

U.S. PATENT DOCUMENTS

| | | | |
|---|---|---|---|
| 2004/0251471 A1 | 12/2004 | Dwilinski et al. | |
| 2004/0256611 A1 | 12/2004 | Kim et al. | |
| 2005/0179027 A1 | 8/2005 | Kim et al. | |
| 2005/0191778 A1* | 9/2005 | Ohtsuka et al. | 438/22 |
| 2006/0138431 A1 | 6/2006 | Dwilinski et al. | |
| 2007/0063207 A1 | 3/2007 | Tanizawa et al. | |
| 2007/0145406 A1 | 6/2007 | Han et al. | |
| 2008/0093610 A1 | 4/2008 | Lee | |
| 2008/0251780 A1 | 10/2008 | Li et al. | |
| 2008/0251781 A1 | 10/2008 | Han et al. | |

FOREIGN PATENT DOCUMENTS

| | | |
|---|---|---|
| JP | 2007-157766 | 6/2007 |
| KR | 10-2004-0016723 | 2/2004 |
| KR | 10-0604406 | 7/2006 |
| WO | 00/30178 | 5/2000 |
| WO | 01-39282 | 5/2001 |
| WO | 02/097904 | 12/2002 |
| WO | 05-101532 | 10/2005 |
| WO | WO 2006022497 A1 * | 3/2006 |
| WO | 2008/082081 | 7/2008 |

OTHER PUBLICATIONS

Non-Final Office Action of U.S. Appl. No. 12/057,842 issued on Sep. 17, 2010.
Final Office Action of U.S. Appl. No. 12/057,842 issued on Apr. 29, 2011.
Non-Final Office Action of U.S. Appl. No. 12/057,842 issued on Sep. 1, 2011.
Non-Final Office Action of U.S. Appl. No. 12/178,758 issued on Jul. 20, 2009.
Non-Final Office Action of U.S. Appl. No. 12/178,758 issued on Jan. 11, 2010.
Final Office Action of U.S. Appl. No. 12/178,758 issued on Jul. 23, 2010.
Non-Final Office Action of U.S. Appl. No. 12/178,758 issued on Nov. 12, 2010.
Final Office Action of U.S. Appl. No. 12/178,758 issued on Apr. 7, 2011.
Non-Final Office Action of U.S. Appl. No. 12/178,758 issued on Jul. 22, 2011.
Notice of Allowance of U.S. Appl. No. 12/178,758 mailed on Nov. 28, 2011.

* cited by examiner

LIGHT EMITTING DIODE HAVING BARRIER LAYER OF SUPERLATTICE STRUCTURE

CROSS-REFERENCE TO RELATED APPLICATIONS

This application is the National Stage of International Application No. PCT/KR2007/005840, filed Nov. 21, 2007, and claims priority from and the benefit of Korean Patent Application No. 10-2006-0136684, filed on Dec. 28, 2006, which are both hereby incorporated by reference for all purposes as if fully set forth herein.

BACKGROUND OF THE INVENTION

1. Field of the Invention

The present invention relates to a light emitting diode, and more particularly, to a light emitting diode having a barrier layer with a superlattice structure.

2. Discussion of the Background

In general, since Group-III-element nitrides, such as GaN, AlN, InGaN and the like, have an excellent thermal stability and a direct-transition-type energy band structure, they have recently come into the spotlight as materials for light emitting diodes (LEDs) in blue and ultraviolet regions. Particularly, an InGaN compound semiconductor has been considerably noticed due to its narrow band gap. LEDs using such a GaN-based compound semiconductor are used in various applications such as large-sized full-color flat panel displays, backlight sources, traffic lights, indoor illumination, high-density light sources, high-resolution output systems and optical communications.

FIG. 1 is a sectional view illustrating a conventional LED.

Referring to FIG. 1, the LED comprises an N-type semiconductor layer 17, a P-type semiconductor layer 21 and an active region 19 interposed between the N-type and P-type semiconductor layers 17 and 21. The N-type and P-type semiconductor layers 17 and 21 are formed of Group-III-element nitride semiconductors, i.e., (Al, In, Ga)N-based compound semiconductors. Meanwhile, the active region 19 is formed to have a single quantum well structure having a single well layer, or a multiple quantum well structure having a plurality of well layers, as shown in this figure. The active region 19 with a multiple quantum well structure is formed by alternately laminating InGaN well layers 19a and GaN barrier layers 19b. The well layers 19a are formed of semiconductor materials with a narrower band gap than the N-type and P-type semiconductor layers 17 and 21 and the barrier layers 19b, thereby providing quantum wells in which electrons and holes are recombined with each other.

Such a Group-III-element nitride semiconductor layer is grown on a different-type substrate 11 with a hexagonal structure, such as sapphire or SiC, using a method, such as metal organic chemical vapor deposition (MOCVD). However, if a Group-III-element nitride semiconductor layer is grown on the different-type substrate 11, a crack or warpage occurs in the semiconductor layer and dislocations are produced due to the difference of lattice constants and thermal expansion coefficients between the semiconductor layer and the substrate.

In order to prevent these problems, a buffer layer is formed on the substrate 11. The buffer layer generally includes a low-temperature buffer layer 13 and a high-temperature buffer layer 15. The low-temperature buffer layer 13 is generally formed of $Al_xGa_{1-x}N(0 \leq x \leq 1)$ at a temperature of 400 to 800° C. using a method, such as MOCVD. The high-temperature buffer layer 15 is then formed on the low-temperature buffer layer 13. The high-temperature buffer layer 15 is formed of a GaN layer at a temperature of 900 to 1200° C. Accordingly, crystal defects in the N-type GaN layer 17, the active region 19 and the P-type GaN layer 21 can be considerably removed.

However, although the buffer layers 13 and 15 are employed, crystal defect density in the active region 19 is still high. Particularly, in order to enhance a recombination rate of electrons and holes, the active region 19 is formed to have a semiconductor layer with a narrower band gap than the N-type and P-type GaN layers 17 and 21. In addition, the well layer 19a is formed of a semiconductor layer with a narrower band gap than the barrier layer 19b. The semiconductor layer with a narrow band gap generally contains a large amount of In and thus has a large lattice constant. Therefore, lattice mismatch occurs between the well layer 19a and the barrier layer 19b and between the well layer 19a and the N-type semiconductor layer 17. Such lattice mismatch between the layers causes pin holes, surface roughness and degradation of crystal structures.

SUMMARY OF THE INVENTION

An object of the present invention is to provide an LED capable of reducing occurrence of crystal defects in an active region.

Another object of the present invention is to provide an LED, in which surface roughness of an active region is improved.

The present invention for achieving the objects provides an LED having a barrier layer with a superlattice structure. The LED according to an aspect of the present invention has an active region interposed between a GaN-based N-type compound semiconductor layer and a GaN-based P-type compound semiconductor layer, wherein the active region comprises a well layer and a barrier layer with a superlattice structure. As the barrier layer with the superlattice structure is employed, it is possible to reduce occurrence of defects caused by lattice mismatch between the well layer and the barrier layer.

The well layer may be formed of InGaN, and the barrier layer may be formed to have a superlattice structure in which InGaN and GaN are alternately laminated. In this case, InGaN in the well layer contains a larger amount of In than InGaN in the barrier layer. Accordingly, it is possible to provide an LED emitting light with various wavelengths in a visual light region by changing an In content in the well layer.

Meanwhile, as InGaN in the barrier layer contains a large amount of In, the number of pin holes is reduced, but hillocks may be produced. It is understood that this is because pin holes are filled with In to prevent them from occurring, but if In is excessively increased, hillocks are produced by surplus In. Accordingly, the In content of InGaN in the barrier layer is appropriately selected to prevent pin holes and hillocks from occurring.

In some embodiments, the well layer is formed of $In_xGa_{(1-x)}N$, and the barrier layer comprises a lower superlattice having $In_yGa_{(1-y)}N$ and GaN alternately laminated, an upper superlattice having $In_yGa_{(1-y)}N$ and GaN alternately laminated, and a middle superlattice interposed between the lower and upper superlattices and having $In_zGa_{(1-z)}N$ and GaN alternately laminated. Here, $0<x<1$, $0<y<0.05$, $0<z<0.1$ and $y<z<x$. According to these embodiments, a superlattice with a large In content is disposed between superlattices with a small In content. Accordingly, superlattices with different In contents are laminated, thereby preventing pin holes and hillocks from occurring.

In other embodiments, composition ratios of InGaN in the well layer and the barrier layer with the superlattice structure may be 0<x<1, 0<y<0.1, 0<z<0.05 and z<y<x. That is, unlike the aforementioned embodiments, a superlattice structure with a small In content is disposed between superlattice structures with a large In content to thereby prevent pin holes and hillocks from occurring.

Each layer in a superlattice structure generally has a thickness of 30 Å or less. In these embodiments, each of $In_yGa_{(1-y)}N$, GaN and $In_zGa_{(1-z)}N$ in the barrier layer may have a thickness of 2.5 to 20 Å Further, the respective layers in the barrier layer may be formed to have almost the same thickness.

In addition, the lower superlattice may have $In_yGa_{(1-y)}N$ and GaN alternately laminated 4 to 10 times, the middle superlattice may have $In_zGa_{(1-z)}N$ and GaN alternately laminated 6 to 20 times, and the upper superlattice may have $In_yGa_{(1-y)}N$ and GaN alternately laminated 4 to 10 times. The number of laminated InGaN and GaN is set such that the thickness of the barrier layer is not excessively increased and pin holes and hillocks are prevented from occurring.

Meanwhile, the active region may be formed to have a single or multiple quantum well structure. In the case of the multiple quantum well structure, the well layers and the barrier layers with a superlattice structure may be alternately laminated.

In addition, the well layers may be interposed between the barrier layers with a superlattice structure. Accordingly, it is possible to reduce strain caused by the lattice mismatch between the N-type or P-type compound semiconductor layer and the well layer.

According to embodiments of the present invention, it is possible to provide an LED, in which a barrier layer with a superlattice structure is employed, thereby reducing crystal defects such as pin holes in an active region and improving surface roughness. Further, there can be provided an LED in which pin holes and hillocks are prevented from occurring in an active region.

DETAILED DESCRIPTION OF THE ILLUSTRATED EMBODIMENTS

Figure 1:
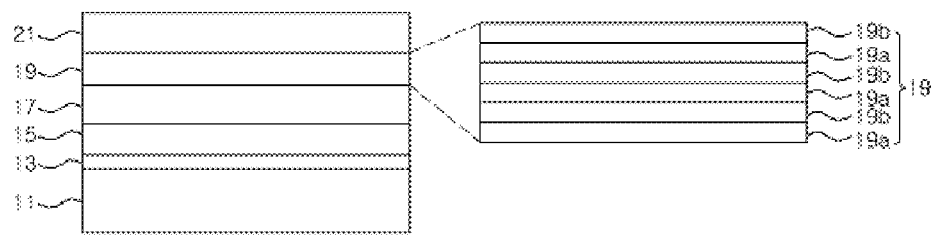
FIG. 1 is a sectional view illustrating a conventional LED.

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements may be exaggerated for convenience of illustration. Like reference numerals indicate like elements throughout the specification and drawings.

Figure 2:
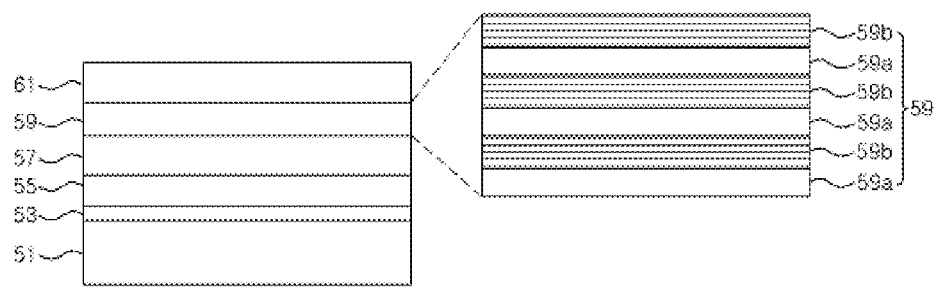
FIG. 2 is a sectional view illustrating an LED having a barrier layer with a superlattice structure according to an embodiment of the present invention.

FIG. 2 is a sectional view illustrating an LED according to an embodiment of the present invention.

Referring to FIG. 2, an N-type compound semiconductor layer 57 is positioned on a substrate 51. In addition, a buffer layer may be interposed between the substrate 51 and the N-type compound semiconductor layer 57. The buffer layer may include a low-temperature buffer layer 53 and a high-temperature buffer layer 55. The substrate 51 is not particularly limited, but may be, for example, a sapphire substrate, a spinel substrate, a SiC substrate, or the like. Meanwhile, the low-temperature buffer layer 53 may be generally formed of $Al_xGa_{1-x}N(0 \leq x \leq 1)$, and the high-temperature buffer layer 55 may be formed of, for example, undoped GaN or n-type GaN doped with n-type impurities.

A P-type compound semiconductor layer 61 is positioned on the N-type compound semiconductor layer 57, and an active region 59 is interposed between the N-type and P-type compound semiconductor layers 57 and 61. The N-type compound semiconductor layer 57, the active region 59 and the P-type compound semiconductor layer 61 are formed with (Al, In, Ga)N-based Group-III nitride semiconductor layers. For example, the N-type and P-type compound semiconductor layers 57 and 61 may be N-type GaN and P-type GaN, respectively.

Meanwhile, the active region 59 comprises well layers 59a and barrier layers 59b with a superlattice structure. The active region 59 may be formed to have a single quantum well structure having a single well layer 59a. In this case, the barrier layer 59b with a superlattice structure is positioned on top and/or bottom of the well layer 59a. As shown in this figure, the active region 59 may be formed to have a multiple quantum well structure in which the well layers 59a and the barrier layers 59b with a superlattice structure are alternately laminated. That is, the InGaN well layers 59a and the barrier layers 59b are alternately laminated on the N-type compound semiconductor layer 57, and the barrier layer 59b has a superlattice structure in which InGaN and GaN are alternately laminated. The InGaN in the well layer 59a has a greater In content than the InGaN in the barrier layer 59b, so that quantum wells are formed.

The barrier layer 59b is formed to have a superlattice structure, thereby preventing crystal defects such as dislocations and pin holes from occurring due to the lattice mismatch between the InGaN well layer 59a and the GaN barrier layer 59b. Meanwhile, if the In content of InGaN in the barrier layer 59b is increased, it is possible to prevent pin holes from being produced, but hillocks occur. It is understood that this is because the hillocks are formed due to surplus In that remains on an InGaN layer. Accordingly, pin holes and hillocks can be prevented from occurring by appropriately controlling the In content in the barrier layer 59b, and the In composition ratio can be adjusted in a range of 0.01 to 0.1.

Meanwhile, in some embodiments of the present invention, a barrier layer 59b with a superlattice structure for preventing pin holes and hillocks from occurring may include InGaNs having different In contents. This will be described in detail below.

Figure 3:
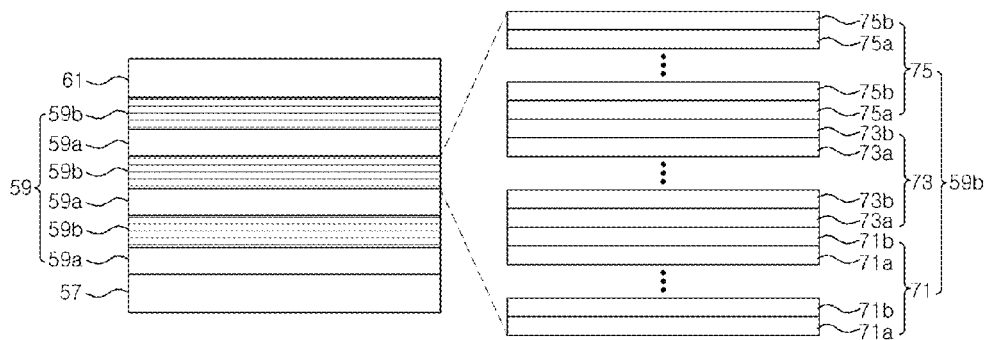
FIG. 3 is a sectional view illustrating a barrier layer with a superlattice structure according to an embodiment of the present invention.

FIG. 3 is an enlarged sectional view of a portion of the active region 59 in FIG. 2 for illustrating a barrier layer 59b with a superlattice structure including InGaNs with different In contents according to an embodiment of the present invention.

Referring to FIG. 3, the well layer 59a may be expressed by $In_xGa_{(1-x)}N$, where $0<x<1$. Meanwhile, the barrier layer 59b with a superlattice structure comprises a lower superlattice 71 having $In_yGa_{(1-y)}N$ 71a and GaN 71b alternately laminated, an upper superlattice 75 having $In_yGa_{(1-y)}N$ 75a and GaN 75b alternately laminated, and a middle superlattice 73 interposed between the lower and upper superlattices 71 and 75. The middle superlattice 73 is formed by alternately laminating $In_zGa_{(1-z)}N$ 73a and GaN 73b. Here, $0<x<1$, $0<y<0.05$, $0<z<0.1$ and $y<z<x$.

The $In_yGa_{(1-y)}N$ 71a or 75a in each of the lower and upper superlattices 71 and 75 has a smaller In content than the $In_zGa_{(1-z)}N$ 73a in the middle superlattice 73. Hence, fine pin holes may be formed in a process of forming the lower superlattice 71. However, the middle superlattice 73 formed thereafter contains surplus In, thus filling the pin holes with the surplus In to thereby remove the pin holes. Meanwhile, the surplus In in the middle superlattice 73 may generate hillocks. Such surplus In is removed by the upper superlattice 75. According to this embodiment, pin holes and hillocks can be prevented from occurring by employing a superlattice containing InGaNs with a small In content and a superlattice containing InGaN with a great In content.

InGaN and GaN in each of the lower, middle and upper superlattices 71, 73 and 75 are alternately laminated. A pair of InGaN and GaN may be repeatedly laminated 4 to 10 times in the lower superlattice 71, 6 to 20 times in the middle superlattice 73 and 4 to 10 times in the upper superlattice 75. The number of laminated InGaN and GaN may be varied depending on thicknesses of InGaN and GaN and the In content in InGaN, and is set to control the occurrence of pin holes and hillocks.

Although it has been described in this embodiment that the InGaN in the lower and upper superlattices 71 and 75 has a smaller In content than the InGaN in the middle superlattice 73, the InGaN in the lower and upper superlattices 71 and 75 may have a greater In content than the InGaN in the middle superlattice 73. That is, In composition ratios in the well layer 59a and the barrier layer 59b may satisfy $0<x<1$, $0<y<0.1$, $0<z<0.05$ and $z<y<x$.

The InGaN and GaN in each of the lower, middle and upper superlattices 71, 73 and 75 may be formed at a temperature of 800 to 900° C. using an MOCVD method. Each of the InGaN and GaN in the barrier layer 59b may have a thickness of 2.5 to 20 Å and they may be formed to have almost the same thickness.

Figure 4:
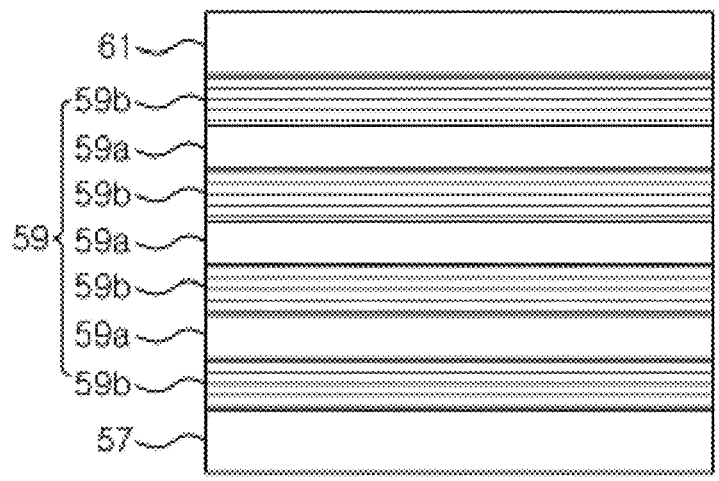
FIG. 4 is a sectional view illustrating an LED having a barrier layer with a superlattice structure according to another embodiment of the present invention.

Meanwhile, although it has been shown in FIG. 3 that the N-type compound semiconductor layer 57 and the well layer 59a are in contact with each other, the barrier layer 59b with a superlattice structure as described with reference to FIG. 3 may be interposed between the N-type compound semiconductor layer 57 and the well layer 59a as shown in FIG. 4. The barrier layer 59b interposed between the N-type compound semiconductor layer 57 and the well layer 59a reduces strain caused by the lattice mismatch between the N-type compound semiconductor layer 57 and the well layer 59a, thereby preventing crystal defects from occurring in the well layer 59a.

In the embodiments of the present invention, the positions of the N-type and P-type compound semiconductor layers 57 and 61 may be changed with each other.

Experimental Example

Figure 5:
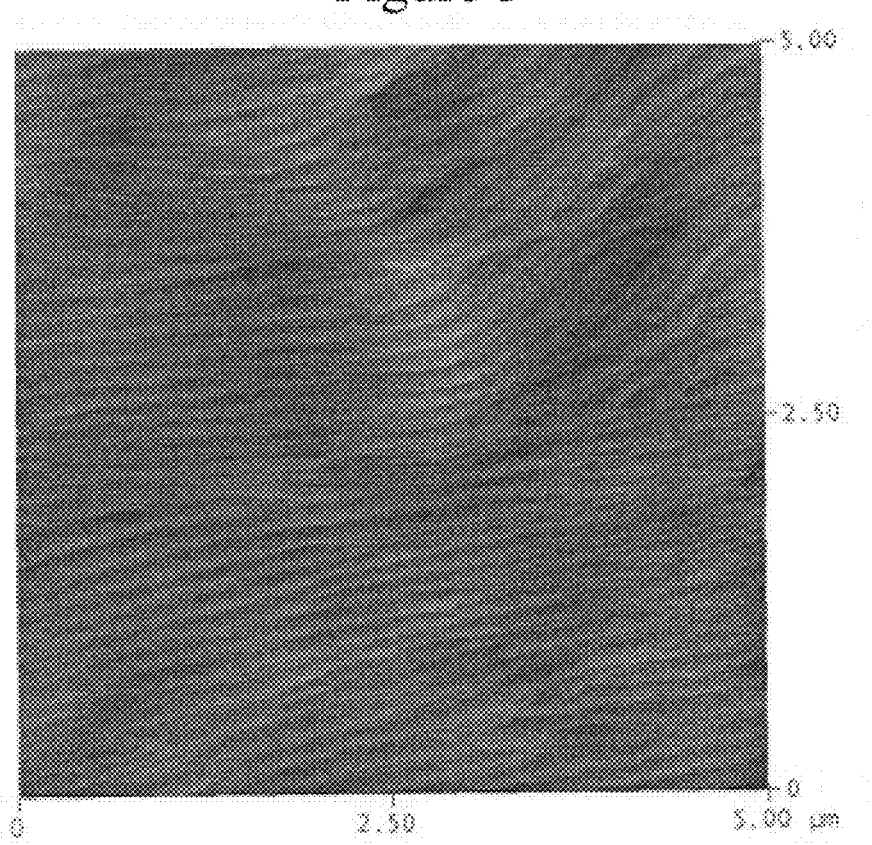
FIG. 5 is an atomic force microscope (AFM) image showing a surface of an N-type GaN layer prior to growth of an active region.
Figure 6:
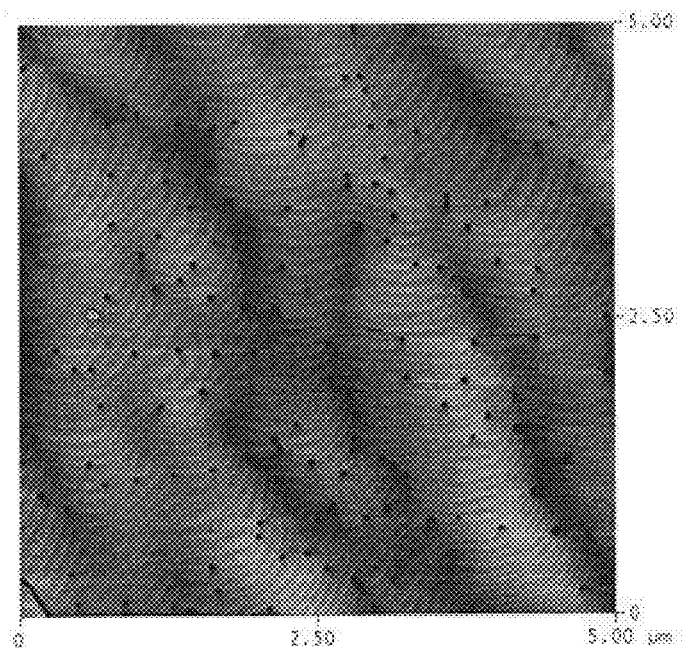
FIG. 6 is an AFM image showing a surface of an active region formed according to a prior art.
Figure 7:
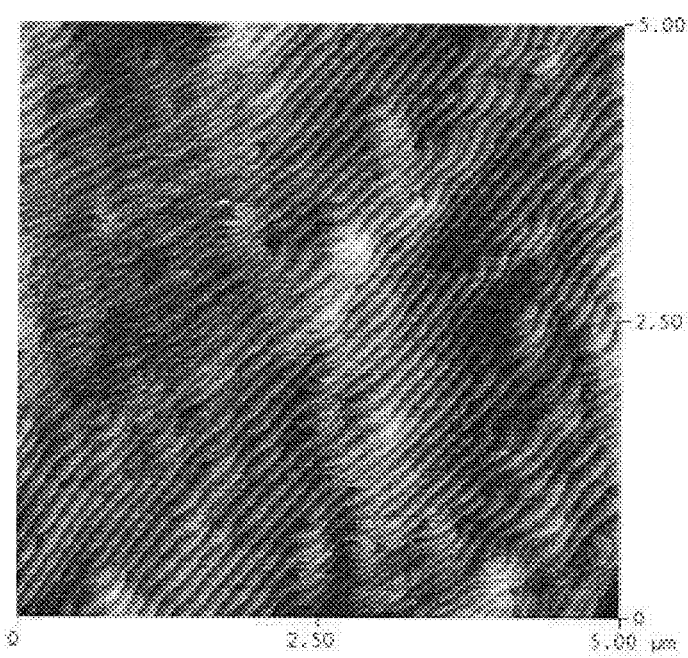
FIG. 7 is an AFM image showing a surface of an active region according to an embodiment of the present invention.

FIG. 5 is an atomic force microscope (AFM) image showing a surface of an N-type GaN layer in a state where a buffer layer is formed on a sapphire substrate and the N-type GaN layer is then formed on the buffer layer according to a prior art. FIG. 6 is an AFM image showing a surface in a state where an InGaN well layer and a GaN barrier layer are alternately laminated four times on the N-type GaN layer of FIG. 5 according to a prior art. FIG. 7 is an AFM image showing a surface in a state where an InGaN well layer and a barrier layer with a superlattice structure are alternately laminated four times on the GaN layer of FIG. 5, where the barrier layer with the superlattice structure was formed by repeatedly laminating InGaN/GaN six times. The barrier layer according to the prior art and the barrier layer with the superlattice structure were formed to have the same thickness (about 160 Å), and other layers were formed under the same condition using an MOCVD method.

As shown in FIG. 5, the N-type GaN layer formed on the buffer layer had a small surface roughness, and no crystal defect such as a pin hole was observed therein. However, as shown in FIG. 6, it can be confirmed that a large number of pin holes were observed in the active region having the InGaN well layer and GaN barrier layer formed according to the prior art, and a surface of the active region was rough. On the contrary, as shown in FIG. 7, no pin hole was observed in the active region having the InGaN well layer and barrier layer with a superlattice structure formed, and surface roughness in the active region was decreased from that in the active region according to the prior art.

The invention claimed is:

1. A light emitting diode (LED) comprising an active region between a GaN-based N-type compound semiconductor layer and a GaN-based P-type compound semiconductor layer,
wherein the active region comprises a well layer and a barrier layer, the barrier layer having a superlattice structure,
wherein the well layer comprises InGaN, the barrier layer comprises the superlattice structure in which InGaN and GaN are alternately laminated, and InGaN in the well layer contains a larger amount of In than InGaN in the barrier layer, and
wherein the well layer comprises $In_xGa_{(1-x)}N$, and the barrier layer comprises a lower superlattice having $In_yGa_{(1-y)}N$ and GaN alternately laminated, an upper superlattice having $In_yGa_{(1-y)}N$ and GaN alternately laminated, and a middle superlattice interposed between the lower superlattice and the upper superlattice, the middle superlattice having $In_zGa_{(1-z)}N$ and GaN alternately laminated, where $0<x<1$, $0<y<0.05$, $0<z<0.1$ and $y<z<x$.

2. The LED of claim 1, wherein each of the $In_yGa_{(1-y)}N$, GaN, and $In_zGa_{(1-z)}N$ in the barrier layer has a thickness in a range from 2.5 to 20 Å.

3. The LED of claim 1, wherein the lower superlattice has $In_yGa_{(1-y)}N$ and GaN alternately laminated 4 to 10 times, the middle superlattice has $In_zGa_{(1-z)}N$ and GaN alternately laminated 6 to 20 times, and the upper superlattice has $In_yGa_{(1-y)}N$ and GaN alternately laminated 4 to 10 times.

4. The LED of claim 1, wherein the active region comprises a multiple quantum well structure in which the well layer and the barrier layer with the superlattice structure are alternately laminated.

5. The LED of claim 4, wherein the well layers are interposed between the barrier layers with the superlattice structure.

6. A light emitting diode (LED) comprising an active region between a GaN-based N-type compound semiconductor layer and a GaN-based P-type compound semiconductor layer, wherein the active region comprises a well layer and a barrier layer, the barrier layer having a superlattice structure, wherein the well layer comprises InGaN, the barrier layer comprises the superlattice structure in which InGaN and GaN are alternately laminated, and InGaN in the well layer contains a larger amount of In than InGaN in the barrier layer, and wherein the well layer comprises $In_xGa_{(1-x)}N$, and the barrier layer comprises a lower superlattice having $In_yGa_{(1-y)}N$ and GaN alternately laminated, an upper superlattice having $In_yGa_{(1-y)}N$ and GaN alternately laminated, and a middle superlattice interposed between the lower superlattice and the upper superlattice, the middle superlattice having $In_zGa_{(1-z)}N$ and GaN alternately laminated, where $0<x<1$, $0<y<0.1$, $0<z<0.05$ and $z<y<x$.

7. The LED of claim 6, wherein each of the $In_yGa_{(1-y)}N$, GaN, and $In_zGa_{(1-z)}N$ in the barrier layer has a thickness in a range from 2.5 to 20 Å.

8. The LED of claim 6, wherein the lower superlattice has $In_yGa_{(1-y)}N$ and GaN alternately laminated 4 to 10 times, the middle superlattice has $In_zGa_{(1-z)}N$ and GaN alternately laminated 6 to 20 times, and the upper superlattice has $In_yGa_{(1-y)}N$ and GaN alternately laminated 4 to 10 times.

* * * * *